US010101784B2

(12) United States Patent
Vaidyanathan et al.

(10) Patent No.: US 10,101,784 B2
(45) Date of Patent: *Oct. 16, 2018

(54) SYSTEM AND METHOD FOR CONTROLLING ENERGY USAGE IN A SERVER

(71) Applicant: Oracle America, Inc., Redwood City, CA (US)

(72) Inventors: Kalyanaraman Vaidyanathan, San Diego, CA (US); Kenneth C. Gross, San Diego, CA (US); David Belanger, San Diego, CA (US); Ayse Kivilcim Coskun, Boston, MA (US)

(73) Assignee: Oracle International Corporation, Redwood Shores, CA (US)

( * ) Notice: Subject to any disclaimer, the term of this patent is extended or adjusted under 35 U.S.C. 154(b) by 95 days.

This patent is subject to a terminal disclaimer.

(21) Appl. No.: 15/169,967

(22) Filed: Jun. 1, 2016

(65) Prior Publication Data
US 2016/0274632 A1    Sep. 22, 2016

Related U.S. Application Data

(63) Continuation of application No. 12/685,841, filed on Jan. 12, 2010, now Pat. No. 9,360,914.

(51) Int. Cl.
| | |
|---|---|
| *G06F 1/00* | (2006.01) |
| *G06F 1/26* | (2006.01) |
| *G06F 1/32* | (2006.01) |
| *H05K 7/14* | (2006.01) |
| *H04L 12/26* | (2006.01) |

(52) U.S. Cl.
CPC .............. *G06F 1/26* (2013.01); *G06F 1/3203* (2013.01); *G06F 1/324* (2013.01); *G06F 1/3296* (2013.01); *H04L 43/0876* (2013.01); *H05K 7/1498* (2013.01); *Y02D 10/126* (2018.01); *Y02D 10/172* (2018.01)

(58) Field of Classification Search
CPC .................................... G06F 1/32; G06F 1/26
See application file for complete search history.

(56) References Cited

U.S. PATENT DOCUMENTS

| | | | |
|---|---|---|---|
| 7,197,411 B1 | 3/2007 | Gross et al. | |
| 7,487,058 B2 | 2/2009 | Gross et al. | |
| 7,757,107 B2 * | 7/2010 | Goodrum | G06F 1/3203 713/300 |
| 2006/0279869 A1 | 12/2006 | Yamamoto et al. | |
| 2007/0294655 A1 * | 12/2007 | Campos | G06F 17/5009 716/106 |
| 2008/0104430 A1 | 5/2008 | Malone et al. | |

(Continued)

*Primary Examiner* — Mohammed Rehman
(74) *Attorney, Agent, or Firm* — Kilpatrick Townsend & Stockton LLP (57) ABSTRACT

A system for controlling energy usage in a server having a processor, where the system includes a memory for storing energy cost information, and a controller for determining a transaction rate for the processor. The controller is also for determining a cumulative of energy expended by the server based on the determined transaction rate for each of a number of available power level states (P-states) for operation of the processor, and for selecting one of the available P-states for operation of the processor based on the determined cumulative energy expended and the stored energy cost information.

20 Claims, 4 Drawing Sheets

(56) References Cited

U.S. PATENT DOCUMENTS

| | | |
|---|---|---|
| 2009/0187782 A1 | 7/2009 | Greene et al. |
| 2009/0235097 A1 | 9/2009 | Hamilton et al. |
| 2010/0058078 A1* | 3/2010 | Branover .............. G06F 1/3203 713/300 |
| 2010/0162023 A1* | 6/2010 | Rotem .................. G06F 1/3203 713/340 |
| 2010/0268968 A1* | 10/2010 | Ghiasi .................. G06F 1/3203 713/300 |
| 2010/0292976 A1 | 11/2010 | Newcombe et al. |
| 2011/0078469 A1* | 3/2011 | Therien ................ G06F 1/3203 713/320 |
| 2012/0053897 A1 | 3/2012 | Naffziger |

* cited by examiner

SYSTEM AND METHOD FOR CONTROLLING ENERGY USAGE IN A SERVER

CROSS-REFERENCE TO RELATED APPLICATION

This application is a continuation of co-pending U.S. patent application Ser. No. 12/685,841 filed Jan. 12, 2010, the disclosure of which is hereby incorporated in its entirety by reference herein.

TECHNICAL FIELD

The following relates o optimizing energy usage in a server, such as a server in a datacenter.

BACKGROUND

Microprocessor manufacturers such as AMD, Intel and Sun Microsystems have recently been implementing approaches to chip-level power management. Such approaches reduce power for chips by clock gating and/or by dynamic voltage and frequency scaling. Scaling back the power to the chips in a server is done out of a desire to save energy and electricity costs.

The various operating states for microprocessor as a result of power management are referred to as power level states, or P-states. Almost all computer industry publications on chip-level power management plot the average power consumed by the chip on the vertical axis over time on the horizontal axis, for each of the available P-states for operating the chip. However, this widespread use of a power curve has led to a significant fallacy throughout the computing industry.

In that regard, while the power level for a server does of course drop with chip-level power management, computations take longer to complete. This undesirable situation is analogous to an automobile manufacturer dynamically scaling back engine horsepower in a misdirected effort to conserve oil. For example, horsepower could be scaled back by disabling engine cylinders from perhaps eight cylinders down to perhaps one cylinder. If, however, a driver still needs to travel a fixed distance from Point A to Point B, that driver may be unhappy to learn that under "horsepower scaling" it not only takes significantly longer to make the trip, but more gasoline must be used as well.

Similarly, while the average power level is reduced with chip-level power management, the consumed energy is typically greater. It is significant to note that every electricity supplier in the United States charges not for power measured in kilo-Watts (kW), but for consumed energy measured in kilo-Watt Hours (kWH). That is, electricity suppliers do not charge for power levels as depicted on the power curves widely used in power management discussions in the computer industry, but for the integral of power over time, which is the area under the power curve.

In most cases, the total energy consumed is actually greater with chip-level power management. In that regard, measurements of work done in various enterprise servers show that chip-level power management typically wastes significant energy, thereby increasing the amount of fuel burned for energy production and the accompanying power plant emissions, driving up the electricity costs for the datacenter, and resulting in longer wait times for computation results.

SUMMARY

According to one embodiment disclosed herein, a system is provided for controlling energy usage in a server comprising a processor. The system comprises a memory for storing energy cost information, as well as a controller. The controller is provided for determining a transaction rate for the processor and, for each of a plurality of available power level states (P-states) for operation of the processor, determining a cumulative of energy expended by the server based on the determined transaction rate. The controller is also provided for selecting one of the available P-states for operation of the processor based on the determined cumulative energy expended and the stored energy cost information.

According to another embodiment disclosed herein, a method is provided for controlling energy usage in a server comprising a processor. The method comprises determining a cumulative of energy expended by the server for each of a plurality of power level states (P-states)available for operation of the processor. The method also comprises selecting one of the plurality of P-states based on the determined cumulative energy expended and energy cost information, and operating the processor in the selected one of the plurality of P-states.

According to a further embodiment disclosed herein, a storage medium is provided having computer executable instructions recorded thereon for controlling energy usage in a server comprising a processor. The computer executable instructions comprise instructions for determining a cumulative of energy expended by the server for each of a plurality of power level states (T-states) available for operation of the processor. The computer executable instructions also comprise instructions for selecting one of the plurality of P-states for operation of the processor based on the determined cumulative energy expended and an instantaneous energy cost. In this embodiment, the selected one of the plurality of P-states is selected to substantially minimize a cost of the energy expended by the server.

A detailed description of these embodiments and accompanying drawings are set forth below.

DETAILED DESCRIPTION

As previously noted, microprocessor chip manufacturers such as AMD, Intel, and Sun Microsystems have recently begun implementing approaches to chip-level power management, such as clock gating and/or dynamic voltage and frequency scaling, that reduce power for chips. By scaling back the power to the chips in the server, the desire is to save energy and electricity costs.

Figure 1:
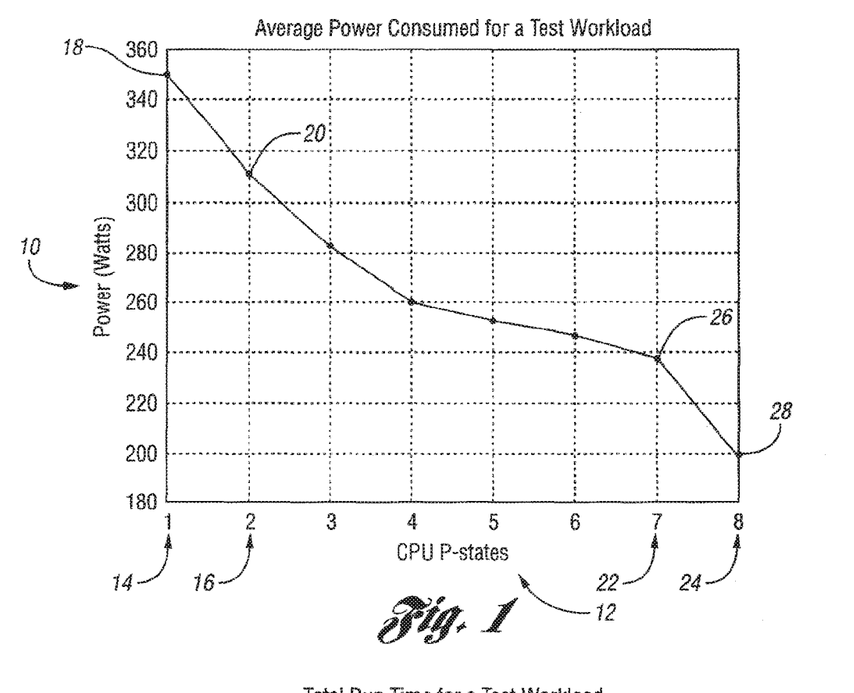
FIG. 1 is a graphical representation of average consumed power for a test workload in a server for a number of power level operating states of a central processing unit.

Almost all computer industry publications concerning chip-level power management depict a power curve showing the power level for the chips on the vertical axis for each of a number of available operating states, or P-states, for the chips. FIG. 1 is a graphical representation of average consumed power for a test workload in a number of P-states of a central processing unit for a commercially available Sun Microsystems server that supports chip-level power management. As seen therein, the instantaneous power level (10) (measured in Watts) is shown for each of a number of available P-states (12).

As is readily apparent from FIG. 1, chip-level power management does indeed reduce instantaneous power levels significantly. More specifically, as seen in Figure processor operation on a test workload at lower P-states, such as P-state 1 (14) and P-state 2 (16), results in higher average power levels of approximately 350 and 310 Watts, respectively (18, 20). Conversely, processor operation at higher P-states, such as P-state 7 (22) and P-state 8 (24), results in lower average power levels of approximately 240 and 200 Watts, respectively (26, 28).

However, this is only a small piece of the picture. The widespread practice of plotting power levels over time for each of the available chip P-states has led to a significant fallacy throughout the computing industry. In that regard, measurements show that, in most cases, chip-level power management actually wastes significant energy, thereby increasing both the amount of fuel required to produce electricity and the accompanying emissions from power plants, driving up the electricity costs for a datacenter, and increasing the time for receiving computation results.

That is, while the power level for a server does of course drop with chip-level power management, computations now take longer to complete and consumed energy is also greater. Significantly, every electricity supplier in the United States charges not for power (measured in kilo-Watts (kW)), but for consumed energy, which is the time integral of power (measured in kilo-Watt Hours (kWH)). Measurements of energy consumed by various enterprise server products while metering the amount of work done (i.e., actually metering the transactions accomplished, input/output operations, instructions completed, etc.) have shown that, in most cases, chip-level power management results in wasting consumed energy. Moreover, the greater total energy that is actually consumed with chip-level power management results in greater energy costs.

Figure 2:
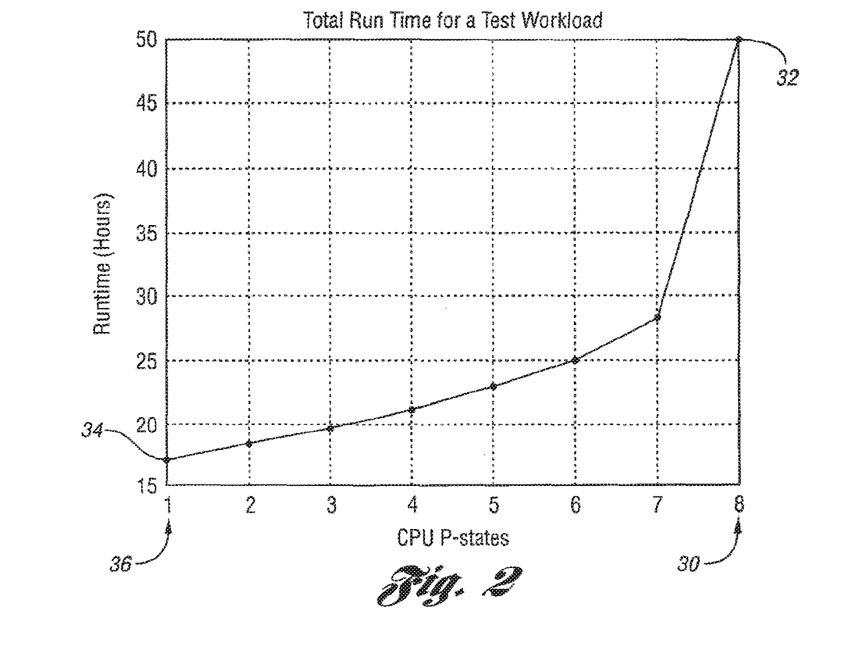
FIG. 2 is a graphical representation of processing run times for a test workload in a number of power level operating states for a central processing unit.

Referring now to FIG. 2, a graphical representation of processing run times is shown for a test workload in a number of power level operating states for a central processing unit. The graph of FIG. 2 depicts the time to complete a large central processor unit (CPU) intensive simulation job. As can be seen, at the highest P-state (i.e., lowest power), P-state 8 (30), an end user has to wait approximately 50 hours (32) for a job to complete. This is nearly three times as long as the end user must wait, approximately 17 hours (34), for a job to complete when the processor is operating at the lowest P-state (i.e., highest power), P-state 1 (36). Perhaps that extra wait would be worthwhile if the power management scheme resulted in conserving energy, reduced fuel usage for power generation and the accompanying emissions, and electricity cost savings for the datacenter. Unfortunately, this is a significant fallacy that has taken hold across the computing industry.

In fact, if the energy used is measure instead of the instantaneous power, it can be seen that running at the highest P-state (i.e., lowest power) actually wastes energy, increases fuel usage and accompanying emissions, and results in much higher electricity costs for the data center. Moreover, because the server is consuming more total energy to get the customer's job done, it is also ejecting more total heat, meaning that air-conditioning systems have to remove more total heat, thereby increasing the overall penalty from chip-level power management.

Even though chip-level power management without measuring the total energy consumed while completing a given customer task fails to recognize these problems, to be fair, if a server is sitting completely idle and doing nothing, then chip-level power management does not hurt anything. If a server is operated according to a policy that disallows shutting that server down, then that server is wasting energy during any time period that the server is idle. In such circumstances, chip-level power management helps to reduce the amount of energy wasted. Recalling the automobile example previously described, if a car is naming but not moving, then "horsepower scaling" by disabling cylinders will help the car waste less energy.

Figure 3:
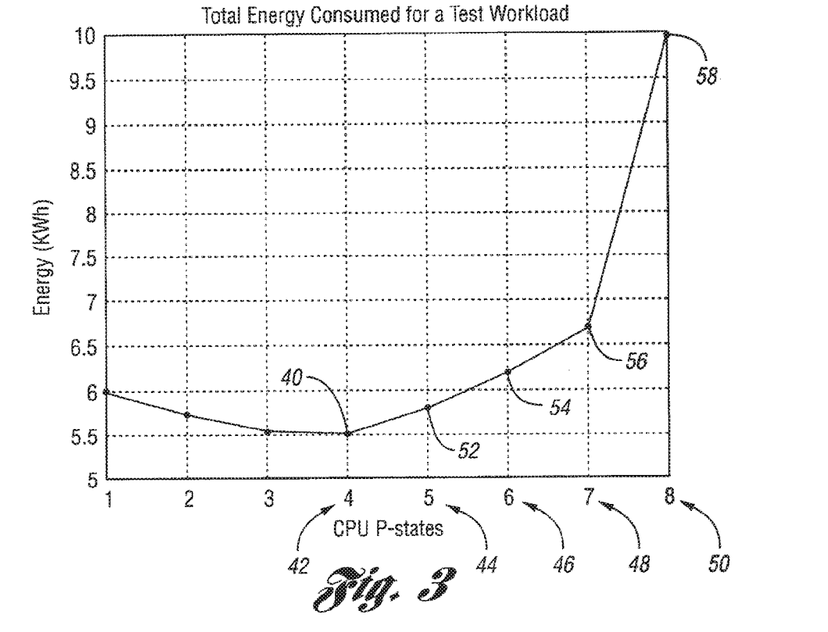
FIG. 3 is a graphical representation of total energy consumed for a test workload in a server for a number of power level operating states for a central processing unit.

Referring next to FIG. 3, a graphical representation of total energy consumed by a server is shown for a test workload in a number of power level operating states for a central processing unit. The graph of FIG. 3 shows the integrated energy used to complete the CPU-intensive simulation job depicted in FIGS. 1 and 2. It is important to note that in FIG. 3 there is an assumption that the electricity costs are uniform with time. If there is such a fixed cost for electricity, then, as shown in FIG. 3, the cost goes through a minimum (40) at about P-state 4 (42). Further increases in P-states (i.e., lowering of chip power) (44, 46, 48, 50) result in increased energy consumption (i.e., wasted energy) (52, 54, 56, 58) and higher electricity costs.

However, electricity costs are not always uniform with time. Indeed, electricity cost are often variable, such as higher costs at peak demand during the day, and lower costs at off-peak times on nights and weekends. Electricity costs may also vary contractually, such as lower costs when a customer (e.g., a datacenter) stays within an agreed upon upper power-cap threshold, and higher costs when the customer exceeds that upper power-cap threshold. If there are such variable costs for electricity, then the curve shown in FIG. 3 is not a static curve with a fixed minimum. Instead, the minimum can change according to the ratio of the percentage of time that the server is utilized to the percentage of time the server is idle (i.e., %_utilization/%_idle) and according to the instantaneous electricity cost for the servers.

As previously noted, for datacenters in many parts of the country, the cost of electricity is not uniform with time. In that regard, there may a cost differential to influence energy-intensive customers to shift usage to low-demand times, and to avoid peak usage times.

Moreover, for very many large data centers, local utilities may provide a contract with a fixed cost as long as the datacenter stays below an agreed upon maximum power level (e.g., 5 MWatts). If the instantaneous power increases above this threshold, then the customer gets charged at substantially higher rates. For some large customers, the rate may jump to a very high fixed value when their aggregate power level exceeds a contractually agreed upon threshold. For still other customers, the rate may jump to "spot market"

rates where the rates are very high and dynamically variable. As one example, a large datacenter may be provided power at a rate of $0.12 per kWHr if the datacenter stays within an agreed upon power budget, but the rate may jump to $1.00 per kWHr if the instantaneous power level exceeds 1 MWatt.

Figure 4:
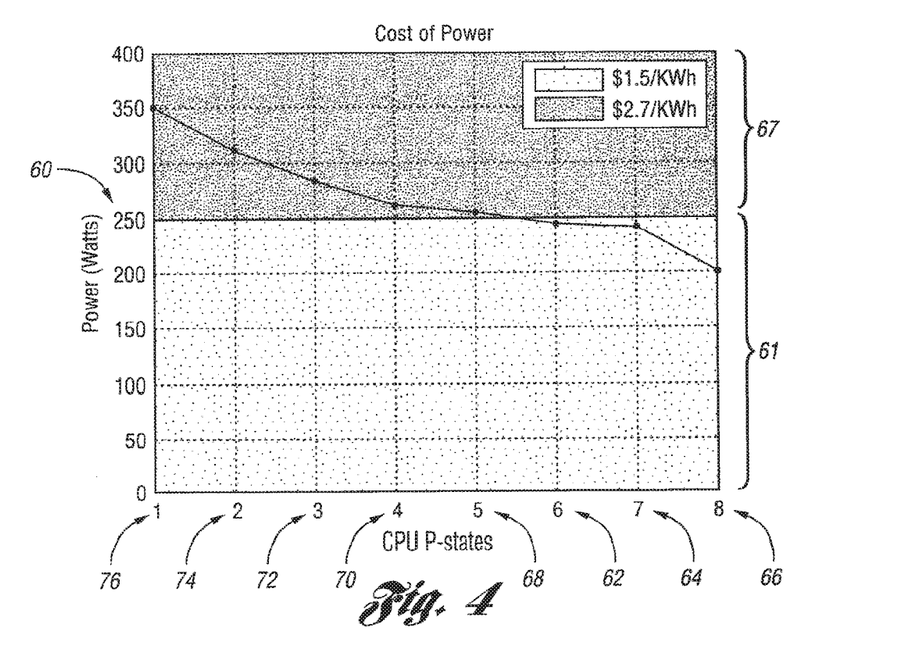
FIG. 4 is a graphical represent lion of the cost of power with a variable power rate for a test workload in a number of power level operating states for a central processing unit.

In that regard, FIG. 4 is a graphical representation of the cost of power with a variable power rate for a test workload in a number of power level operating states for a central processing unit. FIG. 4 depicts hypothetical electricity rates where below an instantaneous power level of 250 Watts (60), electricity costs are $1.50 per kWHr (61). Instantaneous power levels of 250 Watts (60) or below may be achieved by using lower power operating states for a processor such as P-state 6 (62), P-state 7 (64), or P-state 8 (66).

However, above an instantaneous power level of 250 Watts (60), electricity costs rise to $2.70 per kWHr (67). As seen in FIG. 4, instantaneous power levels above 250 Watts (60) may be achieved by using higher power level operating states for a processor such as P-state 5 (68), P-state 4 (70), P-state 3 (72), P-state 2 (74), or P-state 1 (76).

The present disclosure demonstrates an approach that can achieve cost-driven consumed-energy optimization. The approach generally comprises intelligent power monitoring technology, as well as transaction metering. The approach also generally comprises a control strategy that incorporates electricity cost information so that individual servers, as well as aggregates of servers in a large datacenter, may be operated at a lower integrated energy cost. The approach may also result in significantly reduced air conditioning costs for a datacenter.

The disclosed approach for energy optimization for computer servers determines, measures and/or calculates the rate at which transactions are done. This may be accomplished using Kstats for Unix/Solaris/Linux based servers, or a similar operating system utility for Windows or other operating systems, The disclosed approach also determines the cumulative energy expended, which may be obtained via hardware power meters, or via Intelligent Power Monitoring (IPM) technology described in U.S. Pat. No. 7,197,411 entitled "Real-Time Power Harness" and/or U.S. Pat. No. 7,487,058 entitled "Generating Synthetic Workloads To Measure Power Utilization In A Computer System," both of which assigned to the assignee of the present application, Sun Microsystems, Inc., and which are hereby incorporated by reference.

Hardware power meters, however, can be expensive and logistically difficult, due to the need to wire in hundreds or thousands of power meters in existing legacy datacenters. As a result, the advantage of using IPM technology is that it can be ported with no added hardware costs even to the legacy servers in data centers. The disclosed optimization approach factors in the instantaneous cost of electricity and can optimize the P-states for the servers in the datacenter based not on power, as has been the case with conventional power management approaches, but based on total energy consumed, weighted by the instantaneous electricity cost, as the objective function in an energy-efficiency control scheme.

Figure 5:
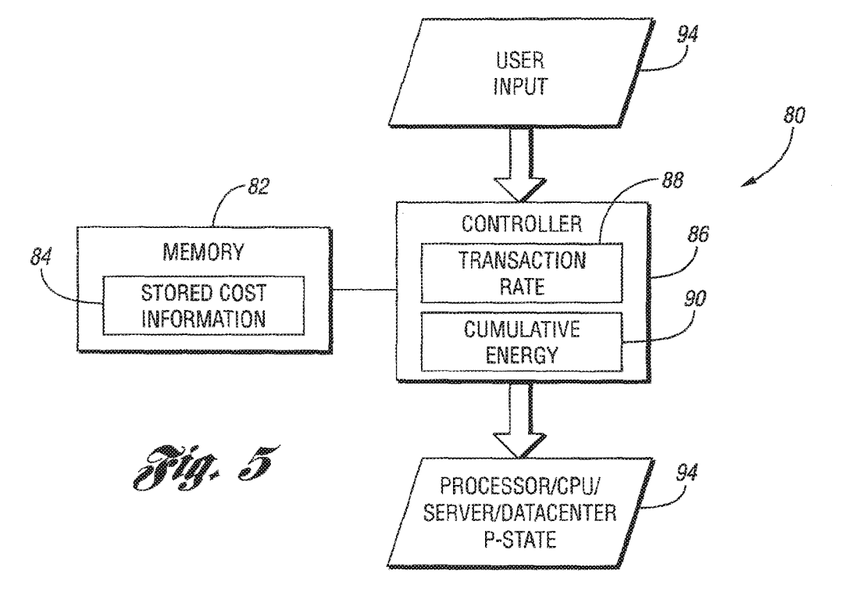
FIG. 5 is an exemplary block diagram of a system according to an embodiment of the present disclosure.

More particularly, FIG. 5 illustrates an exemplary block diagram of a system (80) provided for controlling energy usage in a server comprising a processor. As seen therein, the system (80) may comprise a memory (82) for storing, energy cost information (84), and a controller (86). The memory (82) may be of any type or configuration known in the art, such as a magnetic disk drive, or random access or read-only memory (RAM or ROM). Similarly, the controller (86) may be of any type of configuration known in the art including hardware, with such processors or logic devices as required, firmware or software for carrying out the functions described herein.

The controller (86) may be for determining a transaction rate (88) for the server processor, determining a cumulative of energy expended (90) by the server based on the determined transaction rate for each of a plurality of available power level states (P-states) for operation of the processor, and for selecting one of the available P-states (92) for operation of the processor based on the determined cumulative energy expended and the stored energy cost information.

The stored energy cost (84) information used by controller (86) for selecting one of the available P-states for operation of the processor may comprise an instantaneous energy cost, a fixed energy cost, or a variable energy cost. In that regard, the stored energy cost information (84) may comprise electricity rates for a given times of day, such as peak and off-peak hours, rates dependant on instantaneous power levels, and/or rates that vary over time or based on power consumption.

The controller (86) may select one of the available P-states (92) for operation of the processor to substantially minimize a cost of the energy expended by the server. In addition, or alternatively, the controller (86) may select one of the available P-states (92) for operation of the processor to substantially minimize a cumulative energy expended by the server.

It should be noted that the P-state (92) selected by the controller for operation of the processor may also be based on a user selected target computational throughput (94). Such a target computational throughput (94) may be a target time for completion of a test workload selected by a datacenter user, which could be a minimum or a maximum time. Such a target may also be a range of time, which could be a default range around, below or above a user selected computational throughput. In such a fashion, in addition to optimizing energy consumption and/or energy cost, the present disclosure may also or alternatively allow a user to optimize runtime or transactional throughput.

Figure 6:
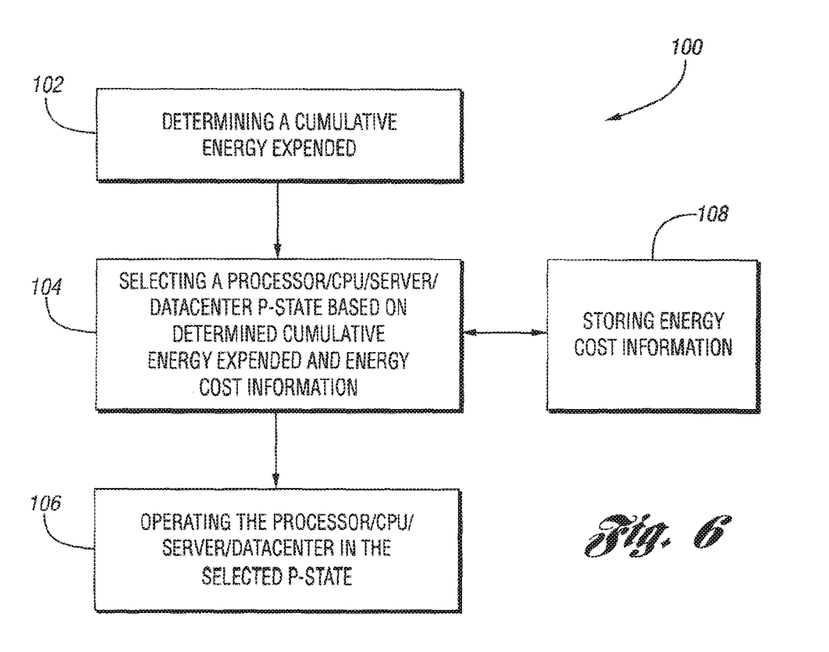
FIG. 6 is an exemplary flowchart of a method according to an embodiment of the present disclosure.

Similarly, FIG. 6 illustrates an exemplary flowchart of a method (100) provided for controlling energy usage in a server comprising a processor. As seen therein, the method (100) comprises determining (102) a cumulative of energy expended by the server for each of a plurality of power level states (P-states) available for operation of the processor, selecting (104) one of the plurality of P-states based on the determined cumulative energy expended and energy cost information, and operating (106) the processor in the selected one of the plurality of P-states. In that regard, determining (102) a cumulative of the energy expended by the server may comprise determining (108) a transaction rate for the processor.

The method (100) may further comprise storing (110) the energy cost information. In that regard, the energy cost information may comprise an instantaneous energy cost, a fixed energy cost, a variable energy cost. As previously described, the stored energy cost information may comprise electricity rates for a given times of day, such as peak and off-peak hours, rates dependant on instantaneous power levels, and/or rates that vary over time or based on power consumption.

According to the method (100), the selected one of the plurality of P-states may substantially minimize a cost of the energy expended by the server. In addition, or alternatively, the selected one of the plurality of P-states may substantially minimize a cumulative energy expended by the server.

Selecting (104) one of the plurality of P-states may further be based on a user selected target computational throughput. As previously described, such a target computational throughput may be a target time for completion of a test workload selected by a datacenter user, which could be a minimum or a maximum time. Such a target may also be a range of time, which could be a default range around, below or above a user selected computational throughput. In such a fashion, in addition to optimizing energy consumption and/or energy cost, the present disclosure may also or alternatively allow a user to optimize runtime or transactional throughput.

There is also provided a storage medium having computer executable instructions recorded thereon for controlling energy usage in a server comprising a processor. The computer executable instructions may comprise instructions for determining a cumulative of energy expended by the server for each of a plurality of power level states (P-states) available for operation of the processor, and selecting one of the plurality of P-states for operation of the processor based on the determined cumulative energy expended and an instantaneous energy cost, where the selected one of the plurality of P-states is selected to substantially minimize a cost of the energy expended by the server.

In that regard, the computer executable instructions for determining a cumulative of energy expended by the server for each of a plurality of P-states may comprise instructions for determining a transaction rate for the processor. Further, the instantaneous energy cost may be a fixed energy cost or a variable energy cost. As previously described, the energy cost may comprise electricity rates for a given times of day, such as peak and off-peak hours, rates dependant on instantaneous power levels, and/or rates that vary over time or based on power consumption.

Figure 7:
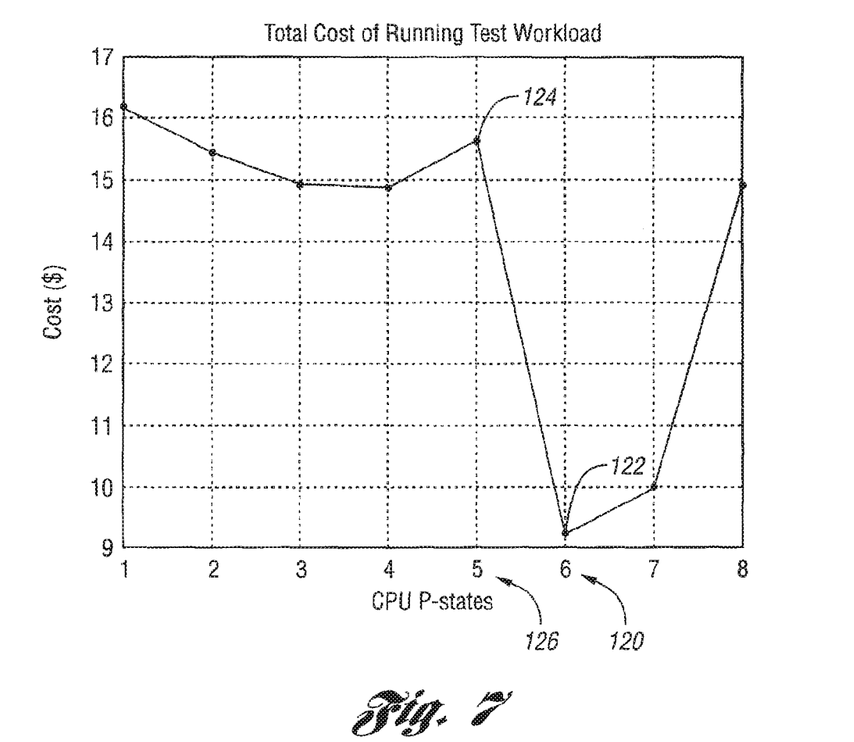
FIG. 7 is a graphical representation of the total cost for a test workload in a number of power level operating state for a central processing unit.

Referring next to FIG. 7, a graphical representation of the total cost for a test workload is shown in a number of power level operating state for a central processing unit. The graph of FIG. 7 is an example that uses the cost differential in electricity rates depicted in FIG. 4 with the integrated energy consumption profile shown in FIG. 3. In that regard, FIG. 7 shows the total cost as a function of P-state for a hypothetical data center full of servers, such as those used for the measurements illustrated in FIGS. 1-3.

As seen in FIG. 7, for this particular example, running the datacenter processors at P-state 6 (120) results in the lowest costs (122) and is significantly less expensive than the cost (124) of running the datacenter processors at P-state 5 (126) or lower P-states with prior-art power management approaches. It should be noted that although FIG. 7 illustrates cost-driven energy optimization using a two-tier cost structure as shown in FIG. 4, the disclosed optimization approach works equally well with dynamically variable electricity costs.

As can be seen from the foregoing description, although new chips from microprocessor manufacturers have integrated capabilities for chip-level power management, such power management only helps to reduce energy waste where a server is powered but sitting idle. Indeed, in most cases, chip-level power management results in wasted energy, thereby resulting in greater use of fuel for power generation and greater accompanying emissions, drives up electricity costs for a datacenter, and also makes a customer wait longer for computation results.

The approach for consumed energy optimization disclosed herein comprises intelligent power monitoring technology (a technique for continuously metering the computational work done), as well as consideration of electricity cost information, in a framework that overcomes the above counter-Eco characteristics of prior-art power management approaches to achieve lower consumed energy utilization and/or lower operating costs. The disclosed approach may also boost workload performance, provide for faster completion times compared with conventional power management approaches, and lower datacenter air conditioning costs.

While embodiments of controlling energy usage in a server have been illustrated and described, it is not intended that these embodiments illustrate and describe all possible forms thereof. Indeed, various modifications to the disclosed embodiments will be readily apparent to those skilled in the art. In that regard, the words used in the specification are words of description rather than limitation, and it is understood that various changes may be made and the general principles described herein may be applied to other embodiments and applications without departing from the spirit and scope of the following claims.

What is claimed is:

1. A system for controlling energy usage in a server comprising at least one microprocessor, the system comprising:
   a memory configured to store energy cost information; and
   a controller comprising one or more processors, the controller configured to:
   for each particular power level operating state (P-state) of a plurality of power level operating states (P-states) supported by the at least one microprocessor:
   (a) perform a particular workload by the at least one microprocessor, while operating at the particular P-state
   (b) determine a cumulative of energy expended by the at least one microprocessor based for performing the particular workload while operating at the particular P-state;
   determine a lowest cost P-state of the plurality of P-states for operation of the at least one microprocessor, based on the determined cumulative energy expended for each of the plurality of P-states, and the stored energy cost information; and
   based on the determination of the lowest cost P-state, operating the at least one microprocessor in the determined lowest cost P-state of the plurality of P-states.

2. The system of claim 1 wherein the controller is further configured to determine the lowest cost P-state of the plurality of P-states for operation of the at least one microprocessor to substantially minimize a cost of the energy expended by the server.

3. The system of claim 1 wherein the controller is further configured to determine the lowest cost P-state of the plurality of P-states for operation of the at least one microprocessor to substantially minimize a cumulative energy expended by the server.

4. The system of claim 1 wherein the controller is further configured to determine the lowest cost P-state of the plurality of P-states for operation of the at least one microprocessor based on a user selected target computational throughput.

5. The system of claim 1 wherein the stored energy cost information comprises an instantaneous energy cost.

6. The system of claim 1 wherein the stored energy cost information comprises a fixed energy cost.

7. The system of claim 1 wherein the stored energy cost information comprises a variable energy cost.

8. A method for controlling energy usage in a server comprising at least one microprocessor, the method comprising:
  for each particular power level operating state (P-state) of a plurality of power level operating states (P-states) supported by the at least one microprocessor:
    (a) performing a particular workload by the at least one microprocessor, while operating at the particular P-state;
    (b) determining, by a controller, a cumulative of energy expended by the at least one microprocessor for performing the particular workload while operating at the particular P-state;
  determining, by the controller, a lowest cost P-state of the plurality of P-states, based on the determined cumulative energy expended for each of the plurality of P-states, and energy cost information; and
  based on the determination of the lowest cost P-state, operating the at least one microprocessor in the determined lowest cost P-state of the plurality of P-states.

9. The method of claim 8 wherein the determined lowest cost P-state of the plurality of P-states substantially minimizes a cost of the energy expended by the server.

10. The method of claim 8 wherein the determined lowest cost P-state of the plurality of P-states substantially minimizes a cumulative energy expended by the server.

11. The method of claim 8 wherein the determination of the lowest cost P-state of the plurality of P-states is further based on a user identified target computational throughput.

12. The method of claim 8 wherein determining the cumulative of the energy expended by the at least one microprocessor, for each particular P-state, comprises determining a transaction rate for the at least one microprocessor while operating at each particular P-state.

13. The method of claim 8 further comprising storing the energy cost information.

14. The method of claim 8 wherein the energy cost information comprises an instantaneous energy cost.

15. The method of claim 8 wherein the energy cost information comprises a fixed energy cost.

16. The method of claim 8 wherein the energy cost information comprises a variable energy cost.

17. The method of claim 8 wherein the server is one of a plurality of servers in a datacenter.

18. A non-transitory storage medium having stored computer executable instructions for controlling energy usage in a server comprising at least one microprocessor, the instructions for execution by a controller to:
  for each particular power level operating state (P-state) of a plurality of power level operating states (P-states) supported by the at least one microprocessor:
    (a) perform a particular workload by the at least one microprocessor, while operating at the particular P-state;
    (b) determine a cumulative of energy expended by the at least one microprocessor for performing the particular workload while operating at the particular P-state;
  determine a lowest cost P-state of the plurality of P-states for operation of the at least one microprocessor, based on the determined cumulative energy expended for each of the plurality of P-states, and energy cost information; and
  based on the determination of the lowest cost P-state, operate the at least one microprocessor in the determined lowest cost P-state of the plurality of P-states.

19. The storage medium of claim 18 wherein, to determine the cumulative of energy expended by the at least one microprocessor, for each particular P-state of the plurality of P-states, the instructions are further for execution by the controller to determine a transaction rate for the at least one microprocessor while operating at each particular P-state.

20. The storage medium of claim 18 wherein the energy cost information comprises a variable energy cost.

* * * * *

UNITED STATES PATENT AND TRADEMARK OFFICE
CERTIFICATE OF CORRECTION

PATENT NO. : 10,101,784 B2
APPLICATION NO. : 15/169967
DATED : October 16, 2018
INVENTOR(S) : Kalyanaraman Vaidyanathan et al.

Page 1 of 1

It is certified that error appears in the above-identified patent and that said Letters Patent is hereby corrected as shown below:

On the Title Page

In the Assignee data (73), please replace "Oracle International Corporation, Redwood Shores, CA (US)" with -- Oracle America, Inc., Redwood City, CA (US) --

Signed and Sealed this
Thirtieth Day of July, 2019

Andrei Iancu
*Director of the United States Patent and Trademark Office*